United States Patent
Aigner et al.

(10) Patent No.: US 7,479,851 B2
(45) Date of Patent: Jan. 20, 2009

(54) PIEZOELECTRIC COMPONENT AND METHOD FOR PRODUCING IT

(75) Inventors: Robert Aigner, Unterhaching (DE); Stephan Marksteiner, Putzbrunn (DE); Winfried Nessler, Munich (DE)

(73) Assignee: Avago Technologies Wireless IP (Singapore) Pte., Ltd., Singapore (SG)

( * ) Notice: Subject to any disclaimer, the term of this patent is extended or adjusted under 35 U.S.C. 154(b) by 0 days.

(21) Appl. No.: 11/930,955

(22) Filed: Oct. 31, 2007

(65) Prior Publication Data
US 2008/0048802 A1 Feb. 28, 2008

Related U.S. Application Data

(60) Division of application No. 10/808,949, filed on Mar. 25, 2004, now Pat. No. 7,310,861, which is a continuation of application No. PCT/EP02/09406, filed on Aug. 22, 2002.

(30) Foreign Application Priority Data
Sep. 25, 2001 (DE) .................. 101 47 075

(51) Int. Cl.
H03H 9/54 (2006.01)
H03H 9/56 (2006.01)
(52) U.S. Cl. .................. 333/189; 333/191; 333/192
(58) Field of Classification Search .................. 333/189
See application file for complete search history.

(56) References Cited

U.S. PATENT DOCUMENTS

| | | | | | |
|---|---|---|---|---|---|
| 3,590,287 | A | * | 6/1971 | Berlincourt et al. | 310/321 |
| 5,382,930 | A | * | 1/1995 | Stokes et al. | 333/191 |
| 5,821,833 | A | * | 10/1998 | Lakin | 333/187 |
| 5,872,493 | A | * | 2/1999 | Ella | 333/191 |
| 5,873,154 | A | * | 2/1999 | Ylilammi et al. | 29/25.35 |
| 5,910,756 | A | * | 6/1999 | Ella | 333/133 |
| 6,542,054 | B2 | * | 4/2003 | Aigner et al. | 333/187 |
| 6,548,942 | B1 | * | 4/2003 | Panasik | 310/364 |
| 6,670,866 | B2 | * | 12/2003 | Ella et al. | 333/133 |
| 6,720,844 | B1 | * | 4/2004 | Lakin | 333/189 |
| 7,310,861 | B2 | * | 12/2007 | Aigner et al. | 29/25.35 |

OTHER PUBLICATIONS

K.M. Lakin et al.; "High Performance Stacked Crystal Filters for GPS and Wide Bandwidth Applications"; 2001 IEEE Ultrasonics Symposium; vol. 1, pp. 833-838, Oct. 7-10, 2001.*

* cited by examiner

*Primary Examiner*—Barbara Summons (57) ABSTRACT

A piezoelectric component comprises at least two stacked crystal filters on a substrate. Each stacked crystal filter comprises a bottom electrode, a first piezoelectric layer arranged above the bottom electrode, a central electrode arranged above the first piezoelectric layer, a second piezoelectric layer arranged above the central electrode, and a top electrode arranged above the second piezoelectric layer. The bottom electrodes are directly connected to one another and the central electrodes are directly connected to one another.

20 Claims, 4 Drawing Sheets

PIEZOELECTRIC COMPONENT AND METHOD FOR PRODUCING IT

CROSS REFERENCE TO RELATED APPLICATION

This application is a divisional of, and claims priority to, U.S. application Ser. No. 10/808,949, filed 25 Mar. 2004, now U.S. Pat. No. 7,310,861, which is a Continuation of application No. PCT/EP02/09406, filed on Aug. 22, 2002, the contents of which application are incorporated herein in their entirety by reference.

TECHNICAL FIELD OF THE INVENTION

The present invention relates to piezoelectric components comprising at least two stacked crystal filters, and to a method for producing such piezoelectric components.

BACKGROUND OF THE INVENTION

As mobile communication and data transmission become increasingly more widespread, there is also an ever increasing interest in the development of filters and resonators or narrowband applications with high stop band attenuation. Filters for GPS devices (global positioning system) having a 10 MHz bandwidth at 1.57 GHz or resonators for frequency standards are examples of such applications.

A high stop band attenuation is usually achieved by using multistage filters in which, by way of example, frequency-shifted series and shunt resonators are connected up in a so-called "ladder structure". Although a virtually optimum bandwidth of the passband can be achieved with said multistage filters, a very large number of stages is necessary for a high stop band attenuation (out-of-band rejection) since the typical stop band attenuation per stage in these filters is only approximately 6.8 dB. Therefore, at the present time, multistage filters having a ladder structure and a stop band attenuation of more than 50 dB cannot be produced in practice.

A higher stop band attenuation per filter stage can be achieved using so-called "balanced" filters, which generally have a bridge circuit of frequency-shifted resonators. However, the use of these types of filters is subject to some significant restrictions. Thus, in "balanced" filters, the input and output signals must be present in differential (balanced) fashion. Therefore, systems in which such types of filter are used require either special antennas and preamplifiers or else particular components or assemblies which convert the so-called "single-ended" signals that are usually present into so-called "balanced" signals.

The filters and resonators that are commercially available at the present time for narrowband applications are predominantly ceramic filters or so-called "surface acoustic wave filters". However, these types of filters can be miniaturized only with difficulty and their production is generally complicated and thus cost-intensive. This makes them unsuitable for use in low price products. Furthermore, these filter structures generally cannot be integrated into the customary processes of semiconductor fabrication.

In addition to surface acoustic wave filters, attempts are also increasingly being made to use so-called "bulk acoustic wave" filters as miniaturized filters and to produce these by means of thin film techniques and substrates. So-called "stacked crystal filters" (SCF) constitute a subgroup of these types of filter. A stacked crystal filter typically comprises two piezoelectric layers and three electrodes. The first piezoelectric layer is arranged between a first, bottom electrode and a second, central electrode, a second piezoelectric layer is arranged between the second, central electrode and a top, third electrode. The central electrode is generally grounded in this case. In order to prevent the acoustic oscillations generated in the piezoelectric layers from propagating in the substrate, the stacked crystal filters may be shielded from the rest of the substrate by acoustic mirrors, for example.

The principle of stacked crystal filters has been known for approximately 40 years, but has been unable to gain general acceptance on an industrial scale in the MHz frequency range since the production of corresponding quartz laminae with center electrodes was not mastered. With the progress in miniaturization technology, in particular the progress in thin-film technology for piezolayers, stacked crystal filters are becoming increasingly attractive again. A corresponding filter for GPS applications is described e.g. in "Stacked Crystal Filters Implemented with Thin Films, K. M. Lakin, G. R. Kline, R. S. Ketcham, J. T. Martin, K. T. McCarron, 43rd Annual Symposium on Frequency Control (1989), pages 536-543". Further examples of the use of miniaturized stacked crystal filters are described for example in the patent specifications U.S. Pat. Nos. 5,910,756 and 5,872,493. The latter describes, moreover, that a stacked crystal filter can be acoustically shielded from the substrate by means of an upper and lower acoustic mirror.

What is common to all the stacked crystal filters described therein, however, is that their production, on account of their complex construction and the associated high number of layers to be deposited and to be patterned, requires a high process outlay which increases the production costs of the filters.

SUMMARY OF THE INVENTION

Therefore, the present invention is based on the object of providing piezoelectric components which significantly reduce or entirely avoid the disadvantages described above. In particular, the object of the present invention is to provide piezoelectric components which can be produced with a relatively low process outlay.

This object is achieved by means of a method for producing a piezoelectric component containing at least two stacked crystal filters, comprising the following steps:

a) providing a substrate;

b) producing at least one bottom electrode on the substrate from a first electrically conductive layer applied on the substrate;

c) applying a layer stack on the substrate at least in the region of the bottom electrode, which layer stack comprises, beginning with the bottommost layer, a first piezoelectric layer, a second electrically conductive layer, a second piezoelectric layer and a third electrically conductive layer;

d) patterning only the third electrically conductive layer and, if appropriate, the second piezoelectric layer, so that at least two stacked crystal filters are produced;

e) contact-connecting the third electrically conductive layer.

At least one opening can be produced in the second piezoelectric layer and, in addition, the second electrically conductive layer can be contact-connected. Before step e), the resonant frequency of at least one of the stacked crystal filters produced can be measured and, if appropriate, in a further step, the layer thickness of the third electrically conductive layer can be corrected by local etching-away. Before step d) and/or e), at least one upper acoustic mirror can be produced, preferably from a layer stack applied on the third electrically conductive layer, the layer stack having at least one layer made of an electrically conductive metal and preferably all the layers of the layer stack being electrically conductive. The upper acoustic mirror may comprise a layer sequence of electrically conductive metals which alternately have a high and low acoustic impedance. The first and second piezoelectric layer may have different layer thicknesses. Before step b), a lower acoustic mirror can be produced in the substrate. The lower acoustic mirror may comprise a lower sequence made of materials having alternately a high and a low acoustic impedance. The bottom electrode, the first piezoelectric layer, the central electrode, the second piezoelectric layer and the top electrode can be deposited in such a way that the layer stack formed from these layers has a layer thickness which corresponds approximately to half the wavelength of the mechanical oscillation of the stacked crystal filters.

The object can also be achieved by a piezoelectric component comprising at least two stacked crystal filters on a substrate, each stacked crystal filter comprising at least one bottom electrode, a first piezoelectric layer arranged above the bottom electrode, a central electrode arranged above the first piezoelectric layer, a second piezoelectric layer arranged above the central electrode, and a top electrode arranged above the second piezoelectric layer, wherein at least two of the respective bottom and of the respective central electrodes of the stacked crystal filters are directly connected to one another.

The bottom electrodes can be ungrounded. The electrical potential of the bottom electrodes may not be defined. The bottom electrodes of at least two stacked crystal filters which are directly connected to one another and their respective direct connection can be formed from one layer. The central electrodes of at least two stacked crystal filters which are directly connected to one another and their respective direct connection can be formed from one layer. The top electrodes of the stacked crystal filters, which are directly connected to one another via their bottom electrodes can be used as signal input or signal output. The piezoelectric component may comprise at least one lower acoustic mirror. At least one upper acoustic mirror can be arranged above the top electrodes. The upper acoustic mirror can be formed from at least one electrically conductive material. The upper acoustic mirror can be directly conductively connected to the top electrodes. The piezoelectric component may comprise at least one contact hole, which extends through the top electrode and the upper piezoelectric layer and via which the central electrode can be connected to a predetermined potential by means of at least one electrically conductive material. The same electrically conductive material can be used for connecting the central electrode to the predetermined potential as for forming the upper acoustic mirror. The piezoelectric component may comprise at least one two-stage single-ended narrowband filter, comprising a first stacked crystal filter, the top electrode of which is connected, as signal input, a second stacked crystal filter, the top electrode of which is connected as signal output, the central electrodes being grounded. The piezoelectric component may comprise at least two series-connected two-stage single-ended narrowband filters. The piezoelectric component may comprise at least one impedance transformer, comprising a first stacked crystal filter, the top electrode of which is connected as signal input, a second stacked crystal filter, the top electrode of which is connected as signal output, the central electrodes of the stacked crystal filters being grounded, and the impedance of the first stacked crystal filter being less than the impedance of the second stacked crystal filter. In the first and second stacked crystal filters, the first piezoelectric layer can be thinner than the second piezoelectric layer. The bottom and the top electrodes may have a different areal form and/or areal content. The piezoelectric component may comprise at least one power divider, comprising at least a first, second and third stacked crystal filter, the top electrode of the first stacked crystal filter being connected as signal input and the top electrodes of the second and third stacked crystal filters in each case being connected as signal output, the bottom electrodes and the central electrodes of the first, second and third stacked crystal filters being directly connected to one another and the central electrodes being grounded. The piezoelectric component may comprise at least one balanced filter, comprising four stacked crystal filters, the central electrodes of which are directly connected to one another and the bottom electrodes of each two stacked crystal filters are directly connected to one another, thereby forming two stacked crystal filter pairs, and, in each stacked crystal filter pair, one top electrode is connected as signal input and one top electrode is connected as signal output. The central electrodes can be grounded. In at least one of the stacked crystal filters of the component, the first electrode, the first piezoelectric layer, the central electrode, the second piezoelectric layer and the top electrode may form a layer stack, whose layer thickness may correspond approximately to half the wavelength of the mechanical oscillation of the stacked crystal filter.

The invention provides a method for producing a piezoelectric component containing at least two stacked crystal filters, comprising the following steps:

a) a substrate is provided;

b) on the substrate, at least one bottom electrode is produced from a first electrically conductive layer applied on the substrate;

c) on the substrate, a layer stack is applied at least in the region of the bottom electrode, which layer stack comprises, beginning with the bottommost layer, a first piezoelectric layer, a second electrically conductive layer, a second piezoelectric layer and a third electrically conductive layer;

d) only the third electrically conductive layer and, if appropriate, the second piezoelectric layer are patterned, so that at least two stacked crystal filters are produced;

e) the third electrically conductive layer is contact-connected.

In this case, the order of method steps d) and e) is not fixed. The contact-connection of the third electrically conductive layer may also be effected before the patterning of the third electrically conductive layer and, if appropriate, of the second piezoelectric layer.

By means of the deposition of the layer stack above the bottom electrode and the subsequent patterning of the upper electrically conductive layer and, if appropriate, second piezoelectric layer, it is possible, in a simple manner, with a minimum of process steps, to produce a piezoelectric component comprising at least two stacked crystal filters which are directly connected to one another via their bottom and central electrodes.

In this case, the central electrodes are produced from the second electrically conductive layer and the top electrodes are produced from the third electrically conductive layer. The two piezoelectric layers are produced from piezoelectric materials which can be applied by means of thin-film techniques, and comprise e.g. zinc oxide (ZnO), aluminum nitride (AlN) or PZT (lead zirconium titanate). However, it is also possible to use any other suitable piezoelectric material for their production.

By way of example, aluminum, aluminum-containing alloys, tungsten, molybdenum or platinum may be used as materials for the electrically conductive layers from which the bottom, central and top electrodes are produced. However, it is also possible to use any other suitable electrically conductive material. By way of example, silicon, GaAs or glass may be used as the substrate material.

In a preferred embodiment of the method according to the invention, at least one opening is produced in the second piezoelectric layer and the second electrically conductive layer is additionally contact-connected. The opening produced or openings produced may serve as contact holes through which, in the component, the central electrodes produced from the second electrically conductive layer can be connected to a predetermined potential.

In a further preferred variant of the method according to the invention, before the contact-connection of the third electrically conductive layer, the resonant frequency of at least one of the stacked crystal filters produced is measured and, if appropriate, in a further step, the layer thickness of the third electrically conductive layer is corrected by local etching-away. This variant makes it possible to optimize the process yield since the so-called "yield" can be by the frequency adjustment during the patterning method. In this case, it is both possible to correct the resonant frequency of an already patterned stacked crystal filter by altering the layer thickness of the third electrically conductive layer, and to use a test measurement on one or a plurality of stacked crystal filters, which have been patterned for example at the edge of the substrate, as a starting point for altering the layer thickness of the third electrically conductive layer in hitherto unpatterned regions in which stacked crystal filters are produced only in one or a plurality of subsequent method steps. Furthermore, it is possible of course, instead of the local etching-away, to alter and thus correct the layer thickness of the third electrically conductive layer by further deposition of material.

In a further preferred variant of the method according to the invention, before the patterning of the third electrically conductive layer and, if appropriate, of the second piezoelectric layer and/or the contact-connection of the third electrically conductive layer, at least one upper acoustic mirror is produced. The latter is preferably produced from a layer stack applied on the third electrically conductive layer, the layer stack comprising at least one layer made of an electrically conductive metal. It is particularly preferred for all the layers of said layer stack to be electrically conductive. This ensures that the entire upper acoustic mirror is electrically conductive. The upper acoustic mirror reflects the acoustic waves generated in the stacked crystal filter and thus acoustically shields the SCF. Producing the upper acoustic mirror from an electrically conductive metal enables a particularly simple contact-connection of the top electrodes, since this can be effected by means of the upper acoustic mirror. This furthermore facilitates the so-called "packaging" of the component, which can thereby be mounted for example by means of so-called "flip-chip mounting" without additional measures.

In a particular preferred variant of the method according to the invention, the upper acoustic mirror is produced from a layer sequence of electrically conductive metals having alternately a high or low acoustic impedance. Suitable metals having a high acoustic impedance are, by way of example, gold (Au), molybdenum (Mo) or tungsten (W). Examples of suitable metals having a low acoustic impedance are aluminum (Al) or titanium (Ti).

In order that the stacked crystal filters are also shielded from the substrate toward the bottom, in a preferred embodiment of the method according to the invention, before the production of the bottom electrode, a lower acoustic mirror is produced in the substrate. Said mirror may be produced from a diaphragm, a cavity or a layer sequence of layers made of materials having alternately a high and low acoustic impedance. Suitable materials having a low acoustic impedance are, by way of example, silicon (Si), polysilicon, aluminum or polymers. Suitable materials having a high acoustic impedance are, by way of example, gold (Au), molybdenum (Mo), tungsten (W) or platinum (Pt).

In a further preferred variant of the method according to the invention, the first and second piezoelectric layers are deposited in different layer thicknesses. This makes it possible to produce components which may serve as impedance transformers.

In a further particularly preferred variant of the method according to the invention, the bottom electrode, the first piezoelectric layer, the central electrode, the second piezoelectric layer and the top electrode are deposited in such a way that the layer stack formed from these layers has a layer thickness which corresponds approximately to half the wavelength of the mechanical oscillation of the stacked crystal filters. As a result, it is possible to produce stacked crystal filters which can be operated in the acoustic fundamental mode and thus achieve a minimal resonator area for a given impedance level.

The invention furthermore comprises a piezoelectric component comprising at least two stacked crystal filters on a substrate, each stacked crystal filter comprising at least one bottom electrode, a first piezoelectric layer arranged above the bottom electrode, a central electrode arranged above the first piezoelectric layer, a second piezoelectric layer arranged above the central electrode, and a top electrode arranged above the second piezoelectric layer. The piezoelectric component according to the invention is characterized in that at least two of the respective bottom and of the respective central electrodes of the stacked crystal filters are directly connected to one another.

The piezoelectric component according to the invention has a particularly simple construction which can be produced with a small number of process steps and thus particularly cost-effectively. The piezoelectric component according to the invention furthermore has the advantage that applications in which a high stop band attenuation is important can be realized with a relatively small number of filter stages. In this case, through the use of at least two stacked crystal filters, it is possible to achieve an excellent out-of-band rejection also for "single-ended" signals.

In a particularly preferred embodiment of the present invention, the bottom electrodes are ungrounded, it being particularly preferred for the electrical potential of the bottom electrodes not to be defined.

In particular, it is preferred for the bottom electrodes of at least two stacked crystal filters which are directly connected to one another and their respective direct connection to be formed from one layer. Furthermore, it is particularly preferred for the central electrodes and their respective direct connection also to be formed from one layer. This structure can be produced in a particularly simple manner.

In a further particularly preferred embodiment of the piezoelectric component according to the invention, the top electrodes of the respective stacked crystal filters are connected as signal input or signal output.

It is particularly preferred for at least one upper acoustic mirror to be arranged above the top electrodes, it being preferred, in particular, for the upper acoustic mirror to be formed from at least one electrically conductive material. Preferably, the upper acoustic mirror is directly conductively connected to the top electrodes. The materials and structures already described in connection with the method according to the invention are taken into consideration as suitable materials and structures for the upper acoustic mirror. As a result, a particularly simple contact-connection of the top electrodes by means of the upper acoustic mirror is made possible in the piezoelectric component according to the invention. As already described for the method according to the invention, this facilitates the "packaging" of the component.

In a further particularly preferred embodiment of the invention, the piezoelectric component comprises at least one lower acoustic mirror in order to acoustically isolate the stacked crystal filters from the substrate. Suitable mirror materials and structures have already been explained in connection with the method according to the invention.

Furthermore, it is particularly preferred for the piezoelectric component according to, the invention to comprise at least one contact hole, which extends through the top electrode, or through the third electrically conductive layer from which the top electrode is produced, and through the upper piezoelectric layer and via which the central electrodes can be connected to a predetermined potential by means of at least one electrically conductive material. It is particularly preferred in this case for the same electrically conductive material to be used for connecting the central electrodes to the predetermined potential as for forming the upper acoustic mirror. This construction of the component can be effected in a particularly simple manner with a minimal number of deposition and patterning steps since the upper mirror and the contact-connection of the central electrode are in this case produced from the same layers.

As already in connection with the methods according to the invention and for the reasons explained there, for the piezoelectric components of the present invention it is particularly preferred for, in at least one stacked crystal filter of the component, the layer thickness of the layer stack comprising bottom electrode, first piezoelectric layer, central electrode, second piezoelectric layer and top electrode to correspond approximately to half the wavelength of the mechanical oscillation of the stacked crystal filter. Preferably, the layer thickness of said layer stack has essentially the same magnitude in all the stacked crystal filters of the component.

In further preferred embodiments of the present invention, the piezoelectric components comprise at least one two-stage single-ended narrowband filter, at least one impedance transformer, at least one power divider and/or at least one balanced filter.

If the piezoelectric component according to the invention comprises an impedance transformer, it is particularly preferred for, in the first and second stacked crystal filters, the first piezoelectric layer to be thinner than the second piezoelectric layer. In this case, it is particularly preferred for the bottom and the top electrodes of the SCF to have a different areal form and/or areal content. This enables a particularly low-reflection impedance transformation between filter input and output.

BRIEF DESCRIPTION OF THE DRAWINGS

The invention is illustrated in more detail below with reference to FIGS. 1 to 7, in which.

DESCRIPTION OF THE INVENTION

Figure 1A:
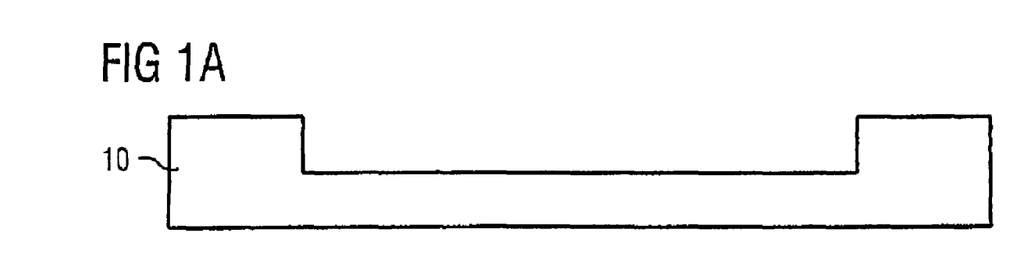
FIGS. 1A to 1E: show the diagrammatic illustration of a preferred embodiment of the method according to the invention.

FIGS. 1A to 1E show a diagrammatic illustration of a preferred embodiment of the method according to the invention. FIG. 1A illustrates a substrate 10, in which a trench has been produced by conventional patterning techniques, e.g. lithography and etching. A layer stack is deposited in said trench, said layer stack containing the layers 52, 54, 56, 58 for producing a lower acoustic mirror 50 and a first electrically conductive layer. The bottom electrode 14 is produced from the first electrically conductive layer.

After the deposition of this layer stack, the lower acoustic mirror 50 and the bottom electrode 14 are patterned. This may be done by means of a CMP method, as is described for example in the German patent application DE 199 47 081.

Figure 1B:
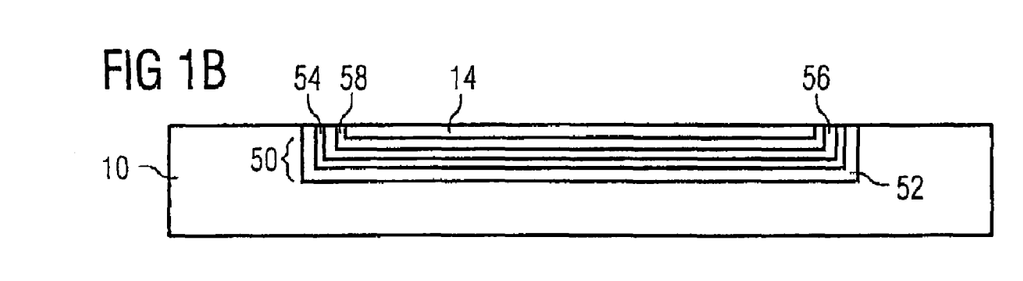
Figure 1C:
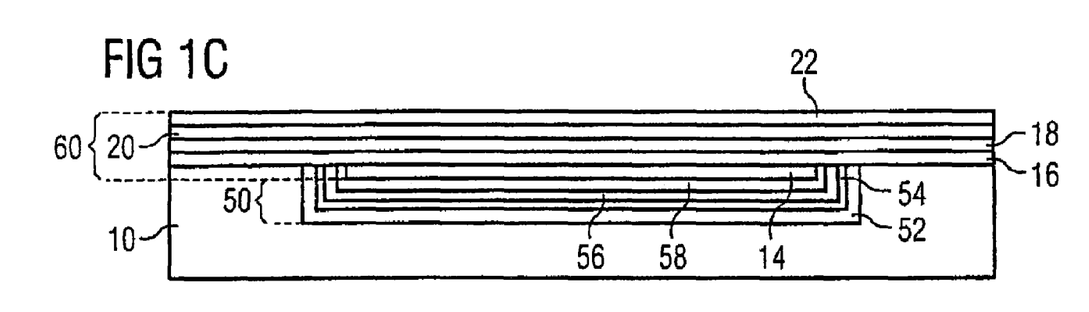

FIG. 1B shows the substrate 10 with the patterned lower acoustic mirror 50 and the patterned bottom electrode 14. The first piezoelectric layer 16, the second electrically conductive layer, the second piezoelectric layer 20 and the third electrically conductive layer 22 are subsequently deposited one after the other onto the substrate with mirror 50 and bottom electrode 14. This is illustrated in FIG. 1C. Afterward, the upper electrically conductive layer 22 may be patterned for example by lithography and etching. Through the patterning of only this one layer 22, it is thus possible, in a simple manner, to produce the two stacked crystal filters 30, 32 with the layer sequence described.

Figure 1D:
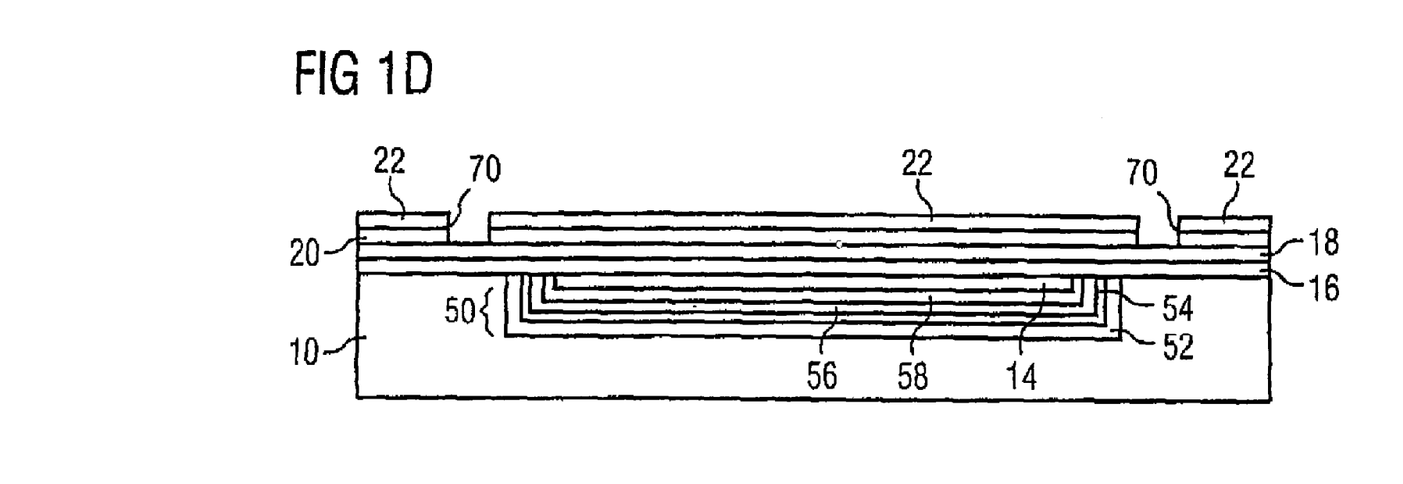

However, in the preferred embodiment of the method according to the invention as illustrated in FIGS. 1A to 1E, firstly openings are produced in the third electrically conductive layer 22 and the second piezoelectric layer 20 in the patterning step illustrated in FIG. 1D. These openings may serve as contact holes via which the central electrode, formed from the second electrically conductive layer 18, can be connected to a predetermined potential, preferably to the ground.

At the same time, it is possible, for example, to produce at least one stacked crystal filter by means of this etching on at least one chosen test region on the substrate. The resonant frequency of the test SCF can then be measured at this test structure in an intermediate step. It goes without saying that it is also possible to produce a plurality of test SCFs on different positions of the substrate. The resonant frequency measured can be used to decide whether it is necessary to subsequently correct the layer thickness of the third electrically conductive layer (22) in order to obtain stacked crystal filters having the desired resonant frequency. The layer thickness of the third electrically conductive layer 22 may, if appropriate, be corrected by local etching-away. This local etching-away may be effected for example by local ion beam etching. It is also conceivable, however, for the layer thickness of the third electrically conductive layer 22 to be increased by further deposition of material.

Figure 1E:
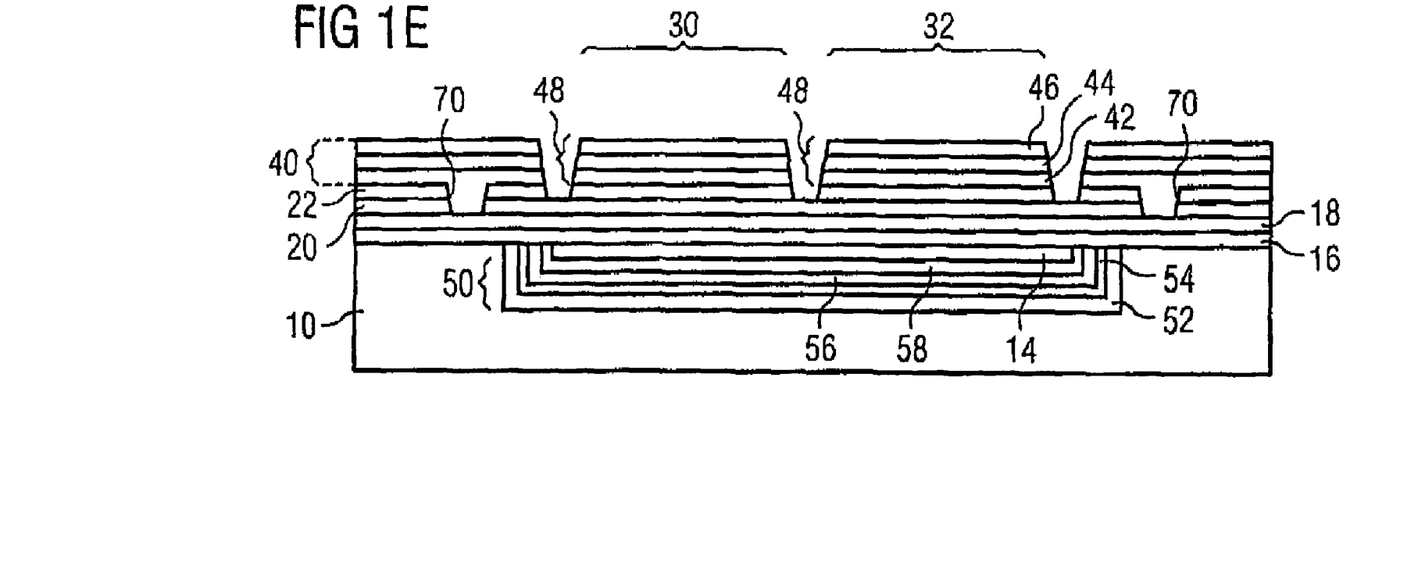

Afterward, as illustrated in FIG. 1E, a layer stack 40 made of different electrically conductive metals 42, 44, 46 is deposited in further deposition steps. In this case, the layer sequence is chosen such that the metals alternately have a high or low impedance. As a result, these metal layers 42, 44, 46 are suitable for producing an upper acoustic mirror 48, which is produced in a subsequent patterning step (FIG. 1E). In addition, by means of the metal layers 42, 44 and 46, it is possible to produce both a conductive connection between the central electrode formed from the second conductive layer 18 and a predetermined potential, e.g. ground, and a connection between the top electrodes formed from the third conductive layer 22 and the signal input or signal output, respectively.

In the patterning step illustrated in FIG. 1E, in addition to the upper acoustic mirror, the stacked crystal filters 30 and 32 are also produced by one or a plurality of corresponding etchings of the metal layers 42, 44, and 46 and of the third electrically conductive layer 22.

The method described previously can achieve, in a particularly simple manner, both the patterning and the contact-connection of the stacked crystal filters in the substrate.

FIGS. 2 to 7 diagrammatically illustrate various preferred embodiments of the piezoelectric components according to the invention. In all these figures, identical structural parts are designated by identical reference numerals. In some figures, these structural parts are provided with the indices (') or (") for the purpose of better distinguishability in the various elements of the components. In some figures, only the essential superordinate elements are provided with reference symbols in order to preserve clarity. In these figures, however, the individual structural parts of the components may be assigned analogous reference symbols, which is directly apparent from the comparison with previous figures. The components described below can be produced particularly simply according to the method disclosed.

Figure 2:
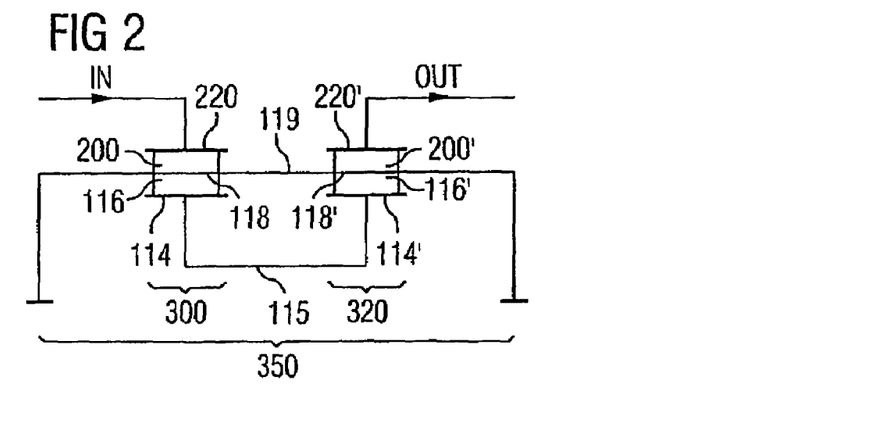
FIG. 2 shows the diagrammatic illustration of a piezoelectric component according to the invention comprising a two-stage single-ended narrowband filter.

FIG. 2 illustrates a preferred embodiment of a piezoelectric component according to the invention which comprises a two-stage single-ended narrowband filter 350.

Said filter is constructed from two stacked crystal filters 300, 320, which are directly connected to one another via their bottom electrodes 114, 114' by means of a common connection 115. Each SCF 300, 320 comprises a first piezoelectric layer 116, 116', a central electrode 118, 118', a second piezoelectric layer 200, 200' and a top electrode 220, 220'. The central electrodes are directly connected to one another via a common connection 119 and are grounded. The top electrode 220 of one SCF 300 is connected to the signal input and the top electrode 220' of the other SCF 320 is connected to the signal output.

Figure 3:
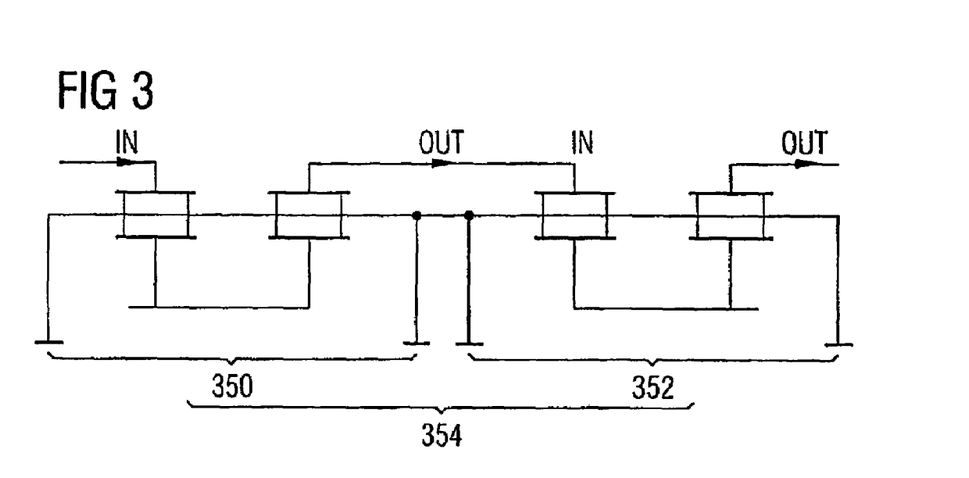
FIG. 3 shows the diagrammatic illustration of a piezoelectric component according to the invention comprising two series-connected two-stage single-ended narrowband filters.

In order to further increase the filter selectivity, in the filter illustrated in FIG. 3, two of the "single-ended narrowband filters" 350, 352 shown in FIG. 2 are interconnected to form a four-stage filter.

Figure 4:
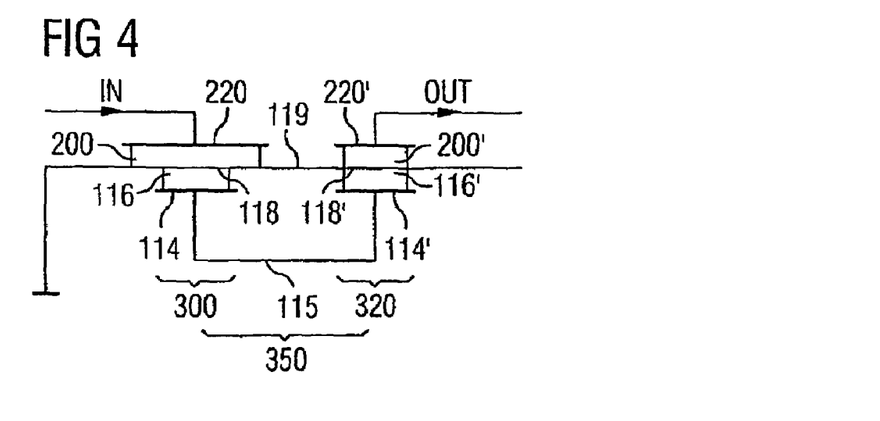
FIG. 4 shows the diagrammatic illustration of a piezoelectric component according to the invention comprising an impedance transformer.

The piezoelectric component illustrated in FIG. 4 acts like an impedance transformer 360. In the embodiment shown there, the impedance transformation is achieved by virtue of the fact that the respective first piezoelectric layers 116, 116' in the SCFs 300, 320 have a smaller layer thickness than the respective second piezoelectric layers. In addition, in one SCF 300 of the impedance transformer 360, the areas of the bottom electrode 114 and of the top electrode 220 are configured with different magnitudes, thereby achieving a low-reflection impedance transformation between filter input and output.

Figure 5:
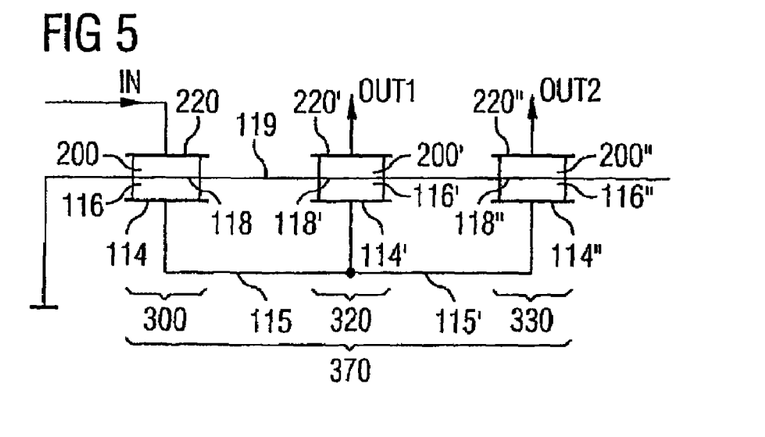
FIG. 5 shows the diagrammatic illustration of a piezoelectric component according to the invention comprising a power divider.

FIG. 5 illustrates a piezoelectric component which serves as a power divider 370. The three SCFs 300, 320, 330 are directly connected to one another via their bottom electrodes 114, 114', 114" and their grounded central electrodes 118, 118', 118". The top electrode 220 of one SCF 300 is connected to the signal input and the top electrodes of the respective other SCFs 320, 330 are connected to the signal outputs.

Figure 6:
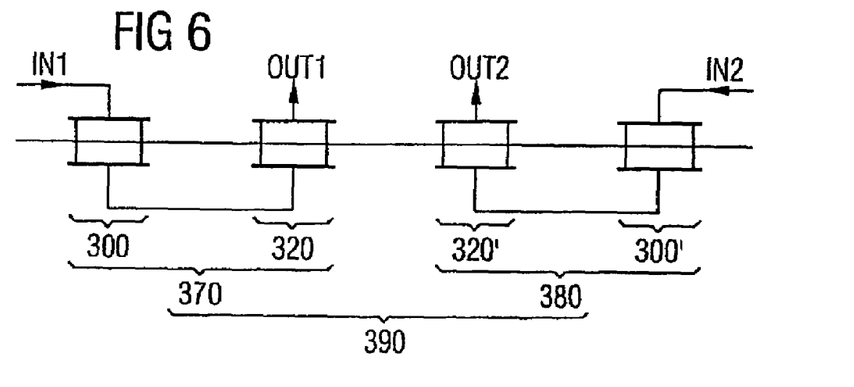
FIG. 6 shows the diagrammatic illustration of a piezoelectric component according to the invention comprising a balanced filter with a "floating" central electrode.
Figure 7:
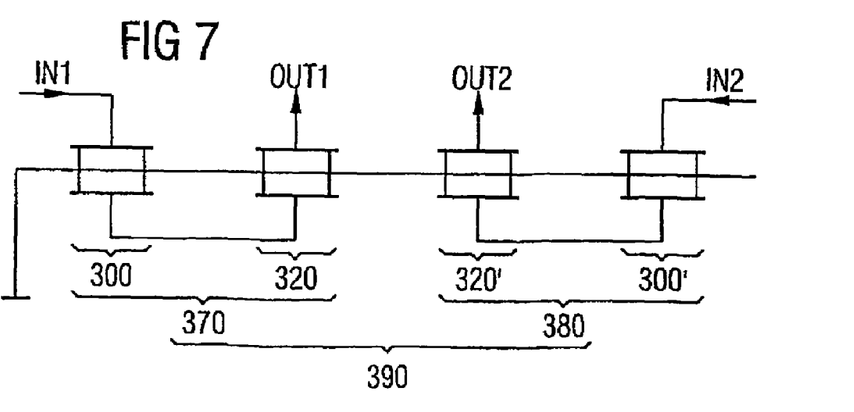
FIG. 7 shows the diagrammatic illustration of a piezoelectric component according to the invention comprising a balanced filter with a grounded central electrode.

The filters illustrated in FIGS. 6 and 7 are balanced filters 390. They comprise in each case four SCFs 300, 320; 300', 320', which are all directly connected to one another via their central electrodes 118. In each case two of the SCFs are directly connected to one another via their respective bottom electrodes, thereby forming two SCF pairs 370, 380. Within an SCF pair 370, 380, the top electrode of one SCF 300, 300' is connected to the signal input and that of the other SCF 320, 320' is connected to the signal output.

In the filter illustrated in FIG. 6, the central electrodes are ungrounded, i.e. "floating", whereas the central electrodes in the filter illustrated in FIG. 7 are connected to the ground.

What is claimed is:

1. A piezoelectric component comprising at least two stacked crystal filters on a substrate, each stacked crystal filter comprising a bottom electrode, a first piezoelectric layer arranged above the bottom electrode, a central electrode arranged above the first piezoelectric layer, a second piezoelectric layer arranged above the central electrode, and a top electrode arranged above the second piezoelectric layer, wherein the bottom electrodes are directly connected to one another and the central electrodes are directly connected to one another, and wherein at least one of the stacked crystal filters has at least one contact hole extending through the top electrode and the upper piezoelectric layer and via which the central electrode can be connected to a predetermined potential by means of at least one electrically conductive material.

2. The piezoelectric component as claimed in claim 1, wherein the bottom electrodes are ungrounded.

3. The piezoelectric component as claimed in claim 1, wherein the electrical potential of the bottom electrodes is not defined.

4. The piezoelectric component as claimed in claim 1, wherein the bottom electrodes are directly connected to one another via a single layer.

5. The piezoelectric component as claimed in claim 1, wherein the central electrodes are directly connected to one another via a single layer.

6. The piezoelectric component as claimed in claim 1, wherein the top electrode of at least one of the stacked crystal filters is connected to a signal input while the top electrode of the remaining stacked crystal filters is connected to a signal output.

7. The piezoelectric component as claimed in claim 1, further comprising at least one lower acoustic mirror arranged below the bottom electrodes.

8. The piezoelectric component as claimed in claim 1, further comprising at least one upper acoustic mirror arranged above the top electrodes.

9. The piezoelectric component as claimed in claim 8, wherein the upper acoustic mirror is formed from at least one electrically conductive material.

10. The piezoelectric component as claimed in claim 9, wherein the upper acoustic mirror is directly conductively connected to the top electrodes.

11. The piezoelectric component as claimed in claim 1, wherein, in at least one of the stacked crystal filters, the bottom electrode, the first piezoelectric layer, the central electrode, the second piezoelectric layer and the top electrode form a layer stack, whose layer thickness corresponds approximately to half the wavelength of the mechanical oscillation of the stacked crystal filter.

12. The piezoelectric component as claimed in claim 1, wherein the at least one electrically conductive material connects the central electrode to the predetermined potential and also forms at least part of an upper acoustic mirror.

13. The piezoelectric component as claimed in claim 1, wherein the top electrode of a first one of the stacked crystal filters is connected to a signal input, the top electrode of a second one of the stacked crystal filters is connected to a signal output and the central electrodes of the first and second stacked crystal filters are grounded to form a two-stage single-ended narrowband filter.

14. The piezoelectric component as claimed in claim 1, wherein the piezoelectric component comprises at least one four stage filter, comprising four stacked crystal filters, the top electrode of a first one of the stacked crystal filters is connected to a signal input, the top electrode of a second one of the stacked crystal filters is connected to the top electrode of a third one of the stacked crystal filters, the top electrode of a fourth one of the stacked crystal filters is connected to a signal output, the bottom electrodes of each two stacked crystal filters are directly connected to one another, and the central electrodes of the first, second, third and fourth stacked crystal filters are grounded to form two series-connected two-stage single-ended narrowband filters.

15. The piezoelectric component as claimed in claim 1, wherein the top electrode of a first one of the stacked crystal filters is connected to a signal input, the top electrode of a second one of the stacked crystal filters is connected to a signal output, the central electrodes of the stacked crystal filters are grounded, and the impedance of the first stacked crystal filter is less than the impedance of the second stacked crystal filter to form an impedance transformer.

16. The piezoelectric component as claimed in claim 15, wherein, the first piezoelectric layer of the first stacked crystal filter is thinner than the piezoelectric layer of the second stacked crystal filter.

17. The piezoelectric component as claimed in claim 15, wherein the bottom and the top electrodes have a different areal form and/or areal content.

18. The piezoelectric component as claimed in claim 1, wherein the top electrode of a first one of the stacked crystal filters is connected to a signal input, the top electrodes of a second and third one of the stacked crystal filters are connected to a signal output, the bottom electrodes of the first, second and third stacked crystal filters are directly connected to one another and the central electrodes of the first, second and third stacked crystal filters are directly connected to one another and grounded to form a power divider.

19. The piezoelectric component as claimed in claim 1, wherein the piezoelectric component comprises at least one balanced filter, comprising four stacked crystal filters, the central electrodes of which are directly connected to one another and the bottom electrodes of each two stacked crystal filters are directly connected to one another, thereby forming two stacked crystal filter pairs, and, in each stacked crystal filter pair, one top electrode is connected to a signal input and the other top electrode is connected to a signal output.

20. The piezoelectric component as claimed in claim 19, wherein the central electrodes are grounded.

* * * * *